United States Patent [19]

Broaddus et al.

[11] Patent Number: 4,916,260

[45] Date of Patent: Apr. 10, 1990

[54] CIRCUIT MEMBER FOR USE IN MULTILAYERED PRINTED CIRCUIT BOARD ASSEMBLY AND METHOD OF MAKING SAME

[75] Inventors: Cynthia J. Broaddus, Binghamton; John R. Jephson, Endicott; Eugene M. Scales, Endicott; Carl C. Sissenstein, Endicott; John P. Wiley, Vestal, all of N.Y.

[73] Assignee: International Business Machines Corporation, Armonk, N.Y.

[21] Appl. No.: 255,310

[22] Filed: Oct. 11, 1988

[51] Int. Cl.[4] .......................... H05K 1/00; H05K 3/00
[52] U.S. Cl. ..................................... 174/268; 29/830; 29/846; 361/414
[58] Field of Search ....................... 174/68.5, 250, 266; 29/829, 830, 846, 847; 361/414

[56] References Cited

U.S. PATENT DOCUMENTS

| | | | |
|---|---|---|---|
| 3,516,156 | 6/1970 | Steranko | 361/414 |
| 3,617,613 | 11/1971 | Benzinger | 174/68.5 |
| 3,739,469 | 6/1973 | Dougherty, Jr. | 361/414 X |
| 3,922,386 | 11/1975 | Ros | 174/68.5 X |
| 3,958,317 | 5/1976 | Peart et al. | 29/195 |
| 3,969,177 | 7/1976 | Doran et al. | 156/288 |
| 4,093,768 | 6/1978 | Cordts et al. | 428/287 |
| 4,105,819 | 8/1978 | Kotcharian | 428/213 |
| 4,191,800 | 3/1980 | Holtzman | 428/251 |
| 4,287,014 | 9/1981 | Gaku et al. | 156/306.9 |
| 4,366,198 | 12/1982 | Ramspacher, Jr. | 174/68.5 |
| 4,378,403 | 3/1983 | Kotcharian | 428/251 |
| 4,400,438 | 8/1983 | Takahashi et al. | 428/458 |
| 4,420,509 | 12/1983 | Barrell et al. | 427/206 |
| 4,446,173 | 5/1984 | Barrell et al. | 427/206 |
| 4,456,657 | 6/1984 | Cassat et al. | 428/415 |
| 4,496,793 | 1/1985 | Hanson et al. | 174/68.5 |
| 4,515,878 | 5/1985 | Hall et al. | 430/5 |
| 4,521,280 | 6/1985 | Bahrle et al. | 204/15 |
| 4,522,667 | 6/1985 | Hanson et al. | 174/68.5 X |
| 4,551,747 | 11/1985 | Gilbert et al. | 361/41 X |
| 4,554,405 | 11/1985 | Varker | 174/68.5 |
| 4,560,962 | 12/1985 | Barrow | 174/68.5 X |
| 4,587,161 | 5/1986 | Barrell et al. | 428/288 |
| 4,662,963 | 5/1987 | Varker | 156/176 |
| 4,662,973 | 5/1987 | Gotov et al. | 29/829 |
| 4,689,270 | 8/1987 | Deckelmann et al. | 428/432 |
| 4,700,016 | 10/1987 | Hitchcock et al. | 174/68.5 |
| 4,705,592 | 11/1987 | Bahrle et al. | 156/630 |

FOREIGN PATENT DOCUMENTS 274795  11/1987  Japan .

OTHER PUBLICATIONS

Angelo, R. W. et al.; Enhanced Continuous Lamination Process for Composites; IBM Technical Disclosure Bulletin; vol. 30, No. 10; Mar. 1988, p. 273.

Haining, F. W. et al.; "Multilayer Printed-Circuit Board"; IBM Technical Disclosure Bulletin; vol. 20, No. 5; Oct. 1977; p. 1723.

Pohl, G. et al.; Producing and Jointly Processing Base Laminates for Multilayer Printed Circuit Cards; IBM Technical Disclosure Bulletin; vol. 27, No. 8; Jan. 1985; p. 4841.

Primary Examiner—Morris H. Nimmo
Attorney, Agent, or Firm—Lawrence R. Fraley

[57] ABSTRACT

An electrically conductive circuit member for use within a multilayered circuit board assembly wherein the member comprises a sheet of electrically conductive material (e.g., copper) and first and second layers of electrically insulative material (e.g., prepreg) bonded thereto to substantially encapsulate the conductive material therein. The conductive material includes a plurality of apertures and a plurality of elongated openings, which openings are mechanically provided in a predefined pattern to assure at least two electrically isolated regions within the singular, planar conductive material. A method of making this circuit member is also defined, said method not requiring the need for wet/chemical processing and the disadvantages associated therewith.

26 Claims, 5 Drawing Sheets

CIRCUIT MEMBER FOR USE IN MULTILAYERED PRINTED CIRCUIT BOARD ASSEMBLY AND METHOD OF MAKING SAME

TECHNICAL FIELD

The invention relates to electrically conductive circuit members (e.g., power planes) and particularly to such members as utilized in multilayered printed circuit boards (e.g., those including multiple layers of power and signal planes). Even further, the invention relates to methods of making such members. One example of usage of such circuit boards is within various information processing equipment (computers).

BACKGROUND

Printed circuit board assemblies and methods of making same are described in the art, with examples being defined in U.S. Pat. Nos. 3,969,177, 4,515,878, 4,521,280, 4,554,405, 4,662,963, 4,700,016 and 4,705,592, all of which are assigned to the assignee of the present invention. Attention is also directed to U.S. Pat. Nos. 3,617,613, 3,922,386, 3,958,317, 4,093,768, 4,191,800, 4,400,438, 4,420,509, 4,446,173, 4,456,657, 4,496,793, 4,522,667, 4,587,161 and 4,689,270 wherein various board structures and techniques for making same are described.

As defined herein, the present invention describes a circuit member (e.g., a power plane) and a process for making same wherein the member eventually forms part of a circuit board assembly of the multilayered variety. Typically, such assemblies as used in computer products include a plurality of signal planes used in combination with associated power planes located at designated levels in the composite structure depending on the product's operational requirements. As stated, assemblies of this type are described in several of the aforementioned patents.

One such method of making a power plane (or core) member involves the steps of laminating several such power planes (each including a central layer of prepreg, a known material comprised of a thermosetting resin impregnated glass fiber having conductive coatings, e.g., copper, on opposing sides thereof) and thereafter processing this laminated "stack" as a singular unit. The prepreg in this instance is provided to add strength during processing but does not electrically isolate the two outer conductive planes. In effect, each resulting power plane thus comprises two individual layers of the conductive copper. These planes, as stated, are laminated and subjected to subsequent operations (e.g., milling, drilling) after which these are separated. Disadvantages of this method include, among others: (1) the entire power plane is electrically active all the way to its outer edges which in turn necessitates "staggered" design power planes of different sizes and patterns if these are to be successfully used in multilayered end products; (2) electrical design is limited to only one voltage level per plane; (3) any damage (e.g., burrs, indentations) at the periphery of such power planes may prove detrimental to the final board (notably, the presence of copper on the outer surfaces of the supporting prepreg promotes burr formation during subsequent drilling); (4) use of such a stacked unit during processing necessitates use of at least two "sacrificial" planes per unit, which two planes must be disposed of following subsequent machining operations; and (5) the requirement of using an interim prepreg layer for support in processing and in the final power plane unit results in additional, undesired thickness to the multilayered board having a plurality of such planes therein.

Another such method of manufacturing power planes involves what is also referred to as the subtractive method. Again, a prepreg layer is used having copper coated on one or both sides thereof. This member is etched (e.g., with a solution of cupric chloride and hydrochloric acid), a photoresist is applied, exposed and developed (using e.g., a solution of sodium carbonate as the developer), the developed member then being etched (e.g., cupric chloride solution) and stripped (e.g., using sodium hydroxide). While this process was able to produce a power plane having electrical isolation therein, it possessed several disadvantages, including particularly the requirement for wet/chemical processing and the several disadvantages associated therewith (e.g., need for complex and elaborate equipment). Additionally, etched holes have proven to be susceptible to residual copper, residual chemical contamination and may also include remnants of the fiber glass cloth and other debris therein. Such holes are thus subject to failure (e.g., by electrical shorting between such holes as plated and other conductors within the composite board).

The power plane produced in accordance with the teachings of the instant invention uniquely provides, among other features, electrical isolation in at least two regions thereof (and several more if desired), can be produced in a facile manner adaptable to mass production, and can be made without wet/chemical processing. In summary, the power plane as defined herein is produced using mechanical procedures which are relatively easy to perform and significantly advantageous in comparison to prior techniques.

It is believed that such a power plane, and a method of making same, would constitute a significant advancement in the art.

DISCLOSURE OF THE INVENTION

It is, therefore, a primary object of this invention to enhance the art of multilayered circuit boards through the provision of a circuit member (e.g., power plane) for use therein, wherein the circuit member possesses, among others, the several advantageous features cited immediately above.

This and other objects are achieved in accordance with one aspect of the invention wherein there is provided an electrically conductive circuit member for use in such a multilayered printed circuit board assembly wherein the member comprises a sheet of electrically conductive material and first and second layers of electrically insulative material bonded to the conductive material to substantially encapsulate the conductive material therein, the conductive material including therein a plurality of apertures and a plurality of elongated openings, the elongated openings formed in a pattern so as to define at least two electrically isolated regions within the conductive material.

In accordance with another aspect of the invention, there is provided a method of making such a conductive member wherein the method comprises the steps of providing a sheet of electrically conductive material, forming a plurality of first openings within the electrically conductive sheet at predetermined locations therein, encapsulating the electrically conductive sheet having the first openings therein between first and second layers of electrically insulative material, providing a plurality of apertures within the encapsulated electrically conductive sheet, and providing a plurality of second openings within the encapsulated electrically conductive sheet relative to the plurality of first openings to define the circuit member having at least two electrically isolated regions within the electrically conductive sheet. The circuit member as produced is adapted for being combined with additional circuit members (e.g., signal planes) to form the multilayered circuit board assembly.

BEST MODE FOR CARRYING OUT THE INVENTION

For a better understanding of the present invention, together with other and further objects, advantages and capabilities thereof, reference is made to the following disclosure and appended claims in connection with the above-described drawings.

In FIGS. 1-9, there are shown the various steps in producing an electrically conductive circuit member capable of being used with a multilayered printed circuit board assembly having therein a plurality of individual circuit members (e.g., power and signal planes). Although particularly directed to the manufacture of a power plane circuit member, it is understood that the teachings herein may also be applicable to the manufacture of conductive circuit members of the signal plane variety. As understood herein, a key feature of the instant invention is a provision of such a power plane circuit member wherein at least two separate electrically isolated regions are found. As further defined, the invention is produced using mechanical means thus avoiding wet/chemical processing and the inherent disadvantages thereof as well as eliminating the aforementioned several disadvantages associated with prior mechanical efforts. The conductive circuit member as produced herein can be implemented within the multilayered circuit board assembly as a ground plane and power plane combination, for example, or in various other combinations readily discernible from the teachings herein (e.g., as a singular power plane having two distinct power levels associated therewith).

Figure 1:
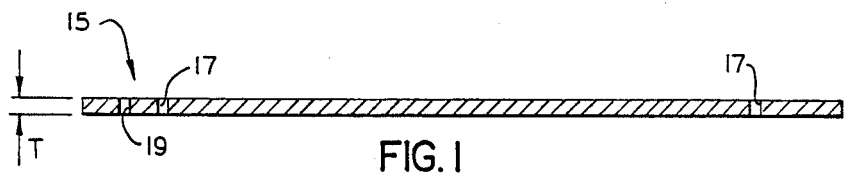
FIGS. 1-9 illustrate the various steps of producing an electrical circuit member in accordance with a preferred embodiment of the invention.

In FIG. 1, there is shown a sheet of electrically conductive material 15, which, in a preferred embodiment, is copper and is provided in sheet form having a width (W) of about twenty-four inches and a length (L) of about twenty-eight inches, and a thickness (T) of from about 0.007 inch to about 0.0112 inch. Alternatively, it is possible to use other metallic materials for this conductive sheet, including copper alloys (e.g., brass, bronze), nickel-iron alloys (e.g., stainless steel, Invar (a trademark of Creusot-Loire, Paris, France)), aluminum, molybdenum, or combinations thereof. Material 15 is oxidized on the upper and lower planar surfaces thereof by exposure of the material to a solution of sodium chloride and sodium hydroxide at temperatures near boiling in order to convert the copper film surface to a more adherent copper oxide. By way of example, such a solution may generally contain from about three to about eight percent by weight chloride. This treatment serves to raise the interlaminate bond strength of the copper layer to a predetermined, desired level (e.g., 5-10 pounds/inch). This technique for oxidizing the surface of the copper material 15 represents but one of several techniques for providing such a surface on this material and is thus not meant to limit the scope of the invention.

Figure 2:
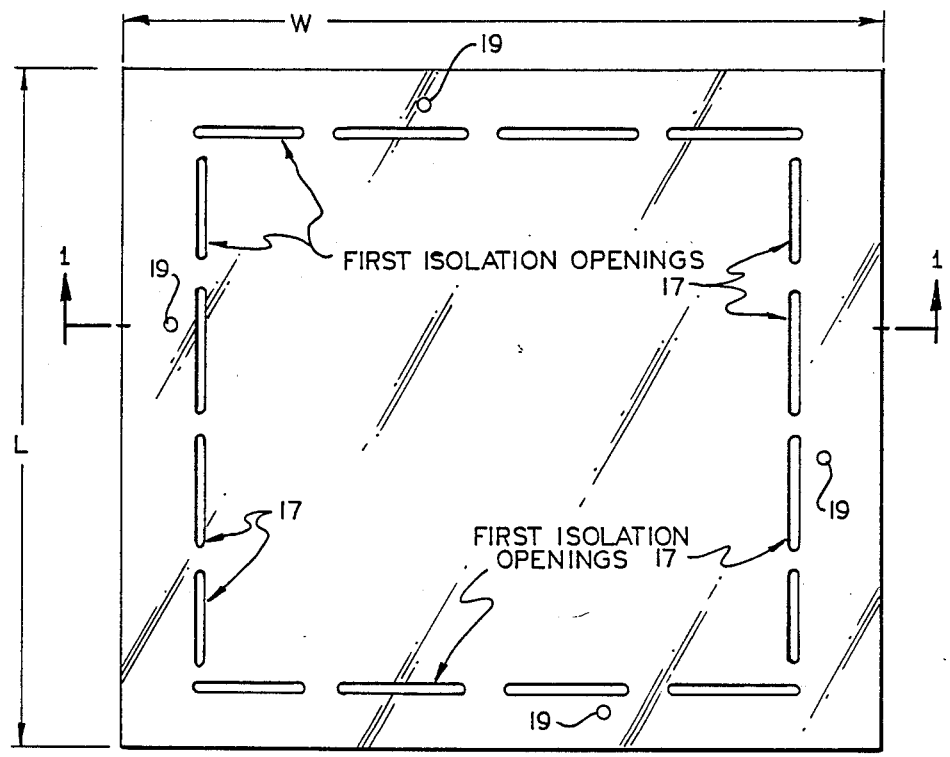

In order to enhance production, several sheets of copper material 15 are arranged in a stacked manner with insulative (e.g., phenolic) separators (not shown) positioned therebetween such that several of these may be treated simultaneously. In such a stacked arrangement, a plurality of first isolation openings 17 are provided at predetermined locations within the material 15. As shown in FIG. 2, these isolation openings are of elongated, narrow configuration and lie substantially along the outer border region of the rectangular sheet. Understandably, this is but one of several orientations for openings 17 in order to provide the two electrically isolated regions for the invention. Clearly, these openings 17 could be arranged in alternative configurations (e.g., through the center of the rectangular sheet to provide two adjacent regions of equal size). In the embodiment exhibited in the drawings, each of the several openings 17 possessed an overall length of about two inches and a width of about 0.125 inch. These openings are provided in each of the several stacked copper sheets in a simultaneous fashion using a milling operation. Alternatively, it is within the scope of the invention to drill or punch these first isolation openings.

As an optional step, a plurality of substantially round fiducial holes 19 are also provided at this stage. These fiducial holes 19 are each located in a precise orientation relative to a respective one of the first isolation openings 17. Utilization of the fiducial holes as defined herein facilitates subsequent alignment of the formed circuit member within equipment designed to provide registration openings (see below) therein, this equipment using a camera which "reads" each of the holes during alignment of the circuit member therein. Use of such fiducial openings is known in the art and further description is thus not believed necessary.

Figure 3:
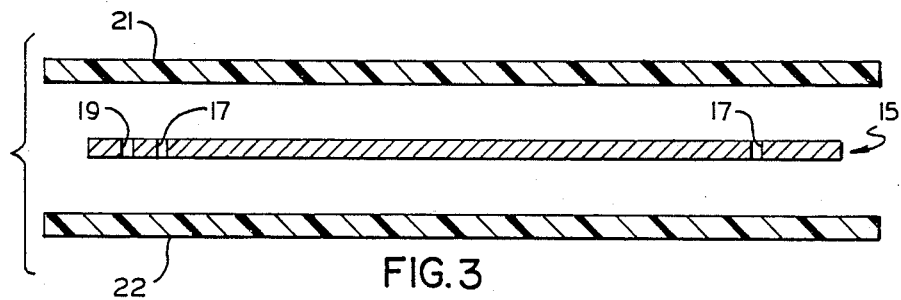

In the next step of the operation for producing the invention, each sheet of conductive material 15 is encapsulated within two layers of prepreg material to form a singular "page" for subsequent treatment. As shown in FIG. 3, each sheet of material 15 is aligned with the respective opposing layers 21 and 23 of prepreg material to form this singular composite "page". Prepreg material is known in the art and typically comprises a glass fiber and a thermosetting resin such as an epoxy or phenolic polyester. In a preferred embodiment, each of the layers of prepreg material 21 and 23 possessed a corresponding width of about twenty-four inches and a length of about twenty-eight inches when used to encapsulate the thin copper sheet having the aforementioned dimensions. At this thickness, each of the prepreg layers, being a known dielectric material, thus contribute to the total insulating characteristics between respective conductive planes in the final, composite structure.

Figure 4:
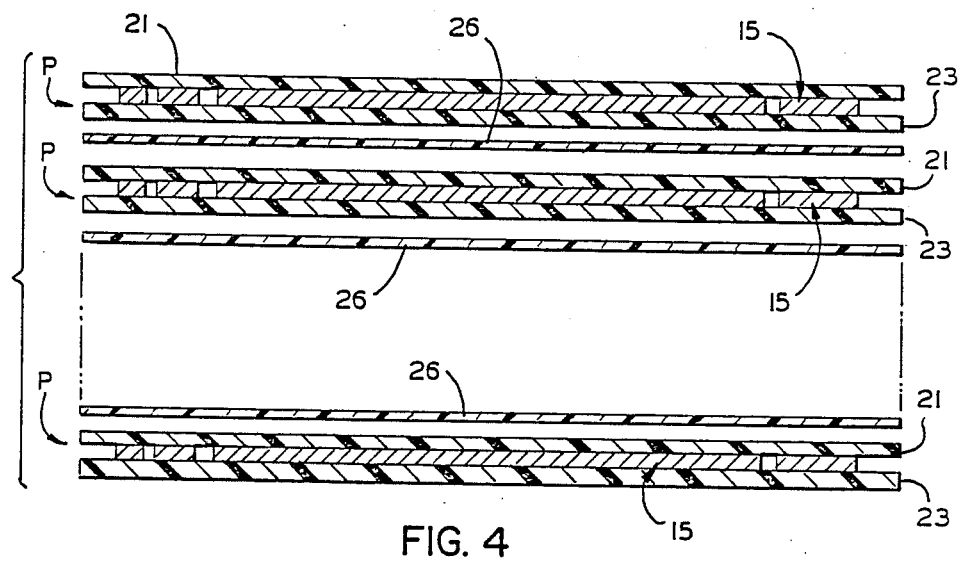

To assemble each "page", a first layer 23 of the prepreg is laid down and the respective copper sheet 15 aligned therewith and atop the copper, after which the second layer 21 of prepreg is laid thereover. Significantly, precise registration (e.g., using pinned alignment) is not essential at this point. This "lay-up" may thus be accomplished manually or by automation. The preferred technique for achieving final encapsulation is to use a lamination step wherein heat and pressure at predefined levels are applied. To further facilitate assembly as defined herein, several "pages" are simultaneously laminated. This step is shown in FIG. 4 wherein each page (P) is shown as being aligned relative to others in a stacked orientation. In one embodiment of the invention, it was possible to simultaneously laminate fifty of such pages in each opening of the laminating press for a total of five hundred pages being simultaneously formed (the press used in this embodiment having ten press openings). In order to achieve this successfully, each page (P) is separated by a non-epoxy adhering material which, in a preferred embodiment, was a polyvinyl fluoride material in sheet form available from the E.I. DuPont de Nemours Company and sold under the trademark Tedlar. This sheet necessarily possessed exterior dimensions slightly greater than those of the corresponding outer prepreg sheets and in turn possessed a thickness of only about 0.001 inch. As defined below, use of this material greatly facilitated subsequent separation of the finally laminated individual pages for subsequent treatment, despite said pages having been subjected to the relatively high pressures and temperatures defined herein.

Figure 5:
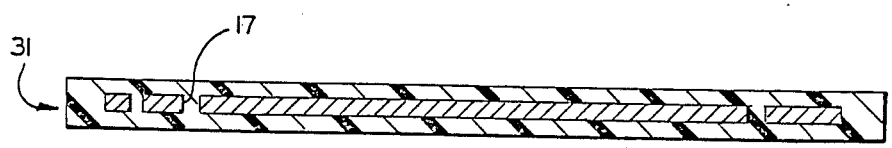

Prior to the above lamination, it is understood that each of the outer prepreg layers 21 and 23 are not fully cured, but instead at the B-stage, a known processing stage for material of this type as used in the art. During final lamination, the prepreg material is fully cured (taken to C-stage) to form the individual, encapsulated circuit member (FIG. 5). The slightly larger Tedlar, represented by the numerals 26 in FIG. 4, thus uniquely serves as a release material to facilitate the aforementioned page separation after lamination.

Lamination of the stacked "pages" occurs using known laminating equipment and applying heat within the range of about 340° F. to about 380° F. and pressure within the range of about 200 to about 700 pounds per square inch (P.S.I.). During this lamination (and encapsulation of each of the separate copper sheets 15 by the prepreg), the prepreg is cured, as stated, and bonded to the copper to form the individual circuit member 31 illustrated in FIG. 5. In one embodiment of the invention, lamination of the aforementioned total of five hundred (in ten groups of fifty each) pages was successfully accomplished at a temperature of about 350° F. and a pressure of about 500 P.S.I. Following lamination, the individual circuit members are easily separated as stated above and the Tedlar release material separated therefrom. This material may be discarded or, if of appropriate strength, reused. Another example of such a release of material which may be retained for subsequent use, if originally of sufficient thickness, is Teflon, a known synthetic polymer available under this trademark also from the E.I. DuPont de Nemours Company.

Significantly, as shown in FIG. 5, lamination of each circuit member 31 results in flow of the prepreg material within each of the isolation openings 17 such that this material now occupies same. This is considered significant because the prepreg material occupying openings 17 is of sufficient strength to retain the outer border region of member 31 when the second isolation openings (45, FIG. 9) are provided such that two separate, isolated regions are formed. The outer surfaces of the encapsulated member 31 are now roughened by subjecting them to a vapor blasting technique wherein a high pressure spray of an aluminum oxide slurry is applied to these surfaces. Alternative procedures for achieving this include sandblasting, peening, etc. Quite surprisingly, the described vapor blasting technique resulted in a work-hardening of the copper sheet member despite encapsulation thereof by the described prepreg material. Such copper material as treated using this technique proved to have greater dimensional (registration) control by a factor of approximately two, when the encapsulated member 31 was combined with additional circuit members to form the multilayered circuit board member, as defined below. That is, the work-hardened copper possessed substantially less deformation in the areas thereof which encountered the locating pins used to align the circuit member with other such members during such formation. Significantly, this treatment also resulted in the substantial elimination of static electricity which may have been formed during removal of the insulative Tedlar material at member separation.

Figure 6:
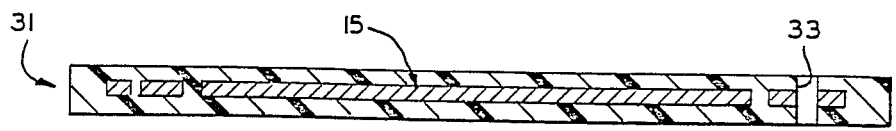
Figure 7:
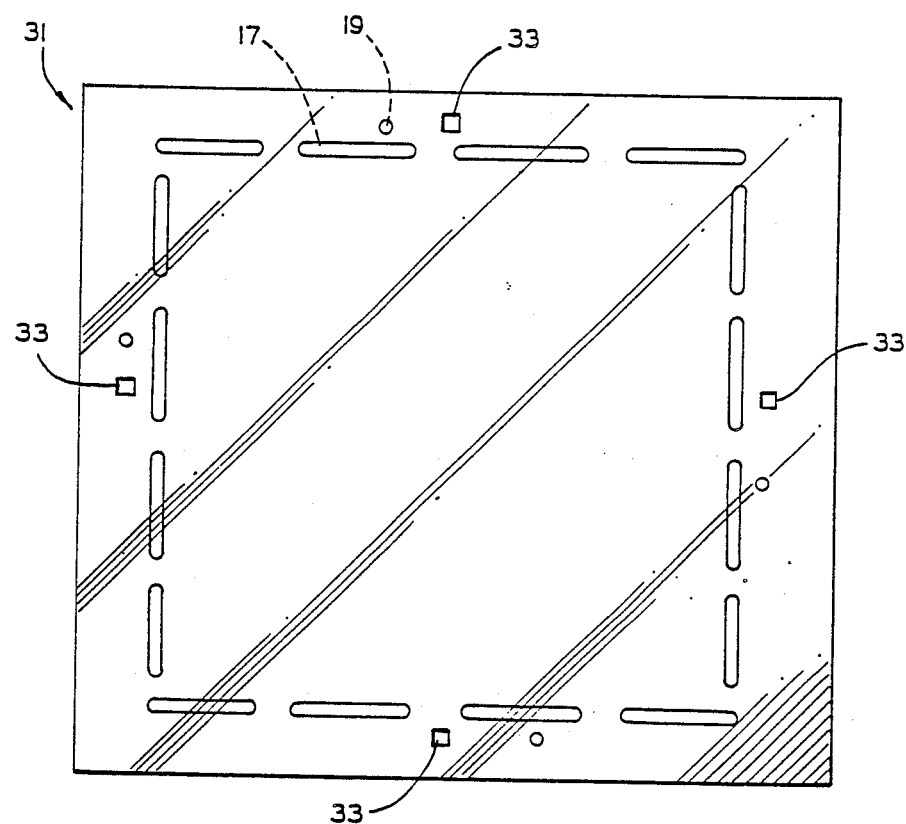
Figure 8:
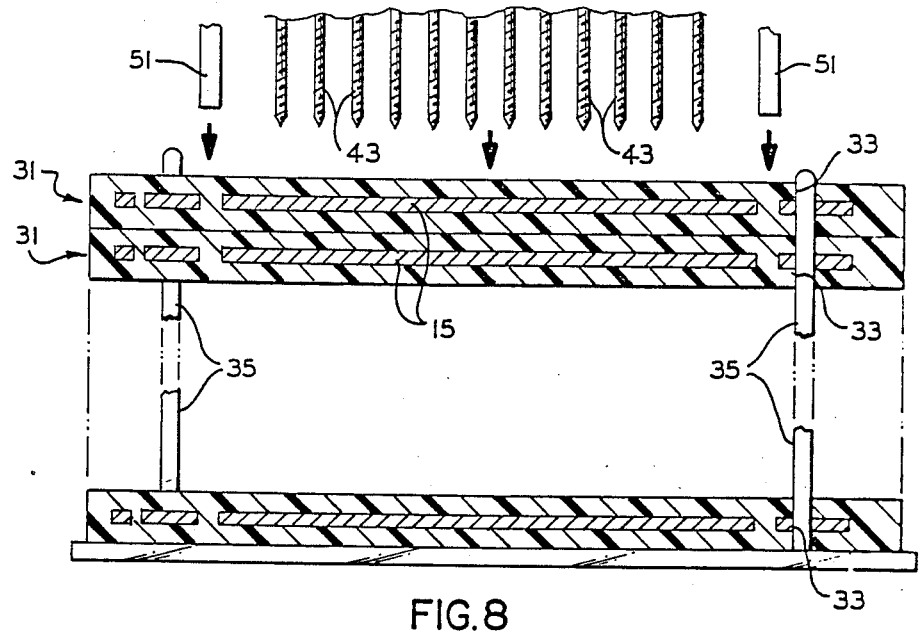

In the next step, a plurality (e.g., four) of registration openings 33 are provided within each of the individual encapsulated circuit members from the outer periphery thereof in the manner depicted in FIG. 7 (see also FIG. 6). These registration openings pass through the entire thickness of each circuit member and are provided using the aforementioned punching equipment having a camera therein (which aligns each member 31 through the described fiducial openings 19) as part thereof. Registration openings 33, as stated, are punched and, as shown in FIG. 7, are of substantially rectangular configuration, but may also be of an alternative configuration (e.g., round). The purpose of registration openings 33 is to facilitate alignment of several of the encapsulated circuit members 31 during subsequent operations. This is illustrated in FIG. 8 wherein each of the registration openings 33 is designed to accommodate a respective upstanding pin 35 which in turn forms part of the stacking (and processing) equipment. Using such equipment, it is thus seen that each of the encapsulated circuit members is aligned in a precise manner in comparison to the others in the stacked array. Clearly, this further facilitates assembly of the invention.

In one embodiment of the invention, a total of twenty-five such encapsulated circuit members 31 were stacked in a defined precisely oriented position on four such upstanding pins 35 for subsequent processing.

In the next step of the invention (FIG. 8), a plurality of clearance apertures 41 are provided within each of the several stacked encapsulated circuit members 31 in a substantially simultaneous fashion. Each of these apertures is designed in the final product for having a pin or other conductive member pass therethrough without providing electrical connection thereto (hence the term clearance). It is also within the scope of the invention, however, to provide apertures at this point of the invention or other openings which function in a different manner. For example, such apertures could be utilized to provide interconnections between circuit layers in the finished, multilayered circuit board. The clearance apertures as defined herein are preferably provided using a mutlispindle drill assembly wherein a plurality of individual drills 43 are used. In one example of the invention, several clearance apertures 41 were drilled within each individual encapsulated circuit member 31 using a repetitive drilling process until the product's design requirements (typically a total of several thousand apertures) were satisfied, said apertures passing through the entire thickness (including outer prepreg and interal copper) of each such member. It is also within the scope of the invention to provide apertures 41 of different sizes within each circuit member (by using different size drills).

Figure 9:
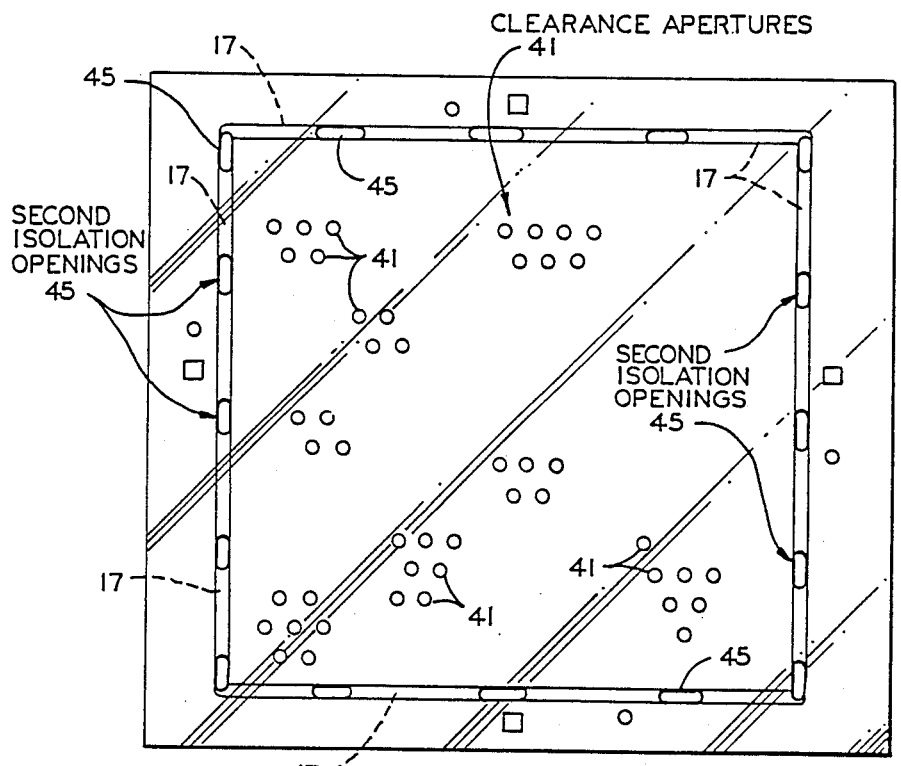

In the nest step of the invention, a plurality of second isolation openings 45 are provided within each circuit member, which openings also pass through the entire thickness thereof. As shown in FIG. 9, these second openings are located relative to the previously provided (and now filled with encapsulant) first openings 17 to thus provide total electrical isolation between the outer, border region of the conductive copper sheet located within the encapsulated circuit member and the internal, centrally located apertured region thereof. Significantly, the two now electrically isolated regions remain physically joined due to the presence of cured prepreg material within the first provided openings 17 and about the outer surfaces thereof providing a bond therebetween to thus uniquely assure a singular, integral encapsulated member. In one embodiment of the invention, each of the second openings 45 possessed a length of about one inch and a width of about 0.125 inch. By the term relative as used in this context is thus meant that the second provided openings align directly with the originally provided first openings to thus assure total severance of conductive material and resulting isolation as stated, these second openings being provided while the individual encapsulated members are oriented in a stacked arrangement such as defined above (twenty-five high). Even further, the preferred method for providing these second openings is by milling using a milling apparatus (represented illustratively by the numerals 51 in FIG. 8) which pass through the several stacked sheets of the board to provide this substantially simultaneous operation.

The aforementioned drilling and milling operations of the clearance aperatures 41 and second isolation openings 45, respectively, can be provided on a singular piece of equipment or alternatively on separate equipment depending on the capabilities thereof. It is also within the scope of the invention to use alternative techniques to those described. For example, it is within the scope of the invention to utilizie a drilling or punching operation to provide second isolation openings 45, as was also possible with first openings 17.

Figure 10:
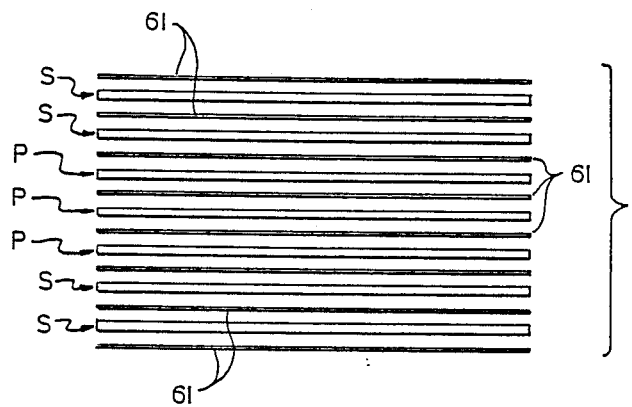
FIG. 10 illustrates the combining of at least one of the members of the invention with other circuit members (e.g., signal and power planes) to form a composite, multilayered circuit board assembly.

Following provision of openings 45, each of the encapsulated circuit members 31, having said openings located therethrough, is separated from the stacked arrangement and adapted for use with other circuit members (e.g., signal planes S as illustrated in FIG. 10) to produce a singular, multilayered printed circuit board assembly. It is understood that the arrangement in FIG. 10 is for illustrative purposes only and not meant to limit the invention in any manner in that various alternative combinations (only four signal and two power planes being shown in FIG. 10) are readily possible. In this stacked arrangement, the signal and power planes are separated, again using partially cured prepreg material, and the stacked arrangement then laminated to provide a composite printed circuit board assembly 60 as partially shown in FIG. 11. The prepreg used at this stage is similar to that mentioned above, is provided in sheet form to form this composite, and is represented by the numeral 61 in FIG. 10. It is understood, however, that although only one sheet is shown between the power and signal planes used, it is within the scope of the invention to provide more (e.g., from one to five such separator members being typical. As stated, it is also possible to orient these signal and power planes in a variety of different orientations.

Figure 11:
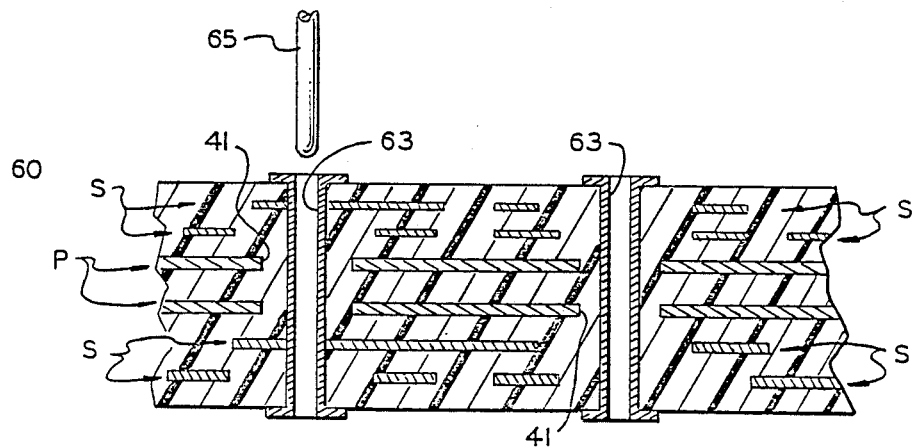
FIG. 11 is a partial view, in section, representing an example of such a multilayered circuit board assembly including, as part thereof, at least two circuit members produced in accordance with the teachings herein.

Also shown in FIG. 11, electrically conductive (e.g., copper) plated through holes (PTH's) 63 are shown as passing through the composite assembly 60. These PTH's may serve as power or signal connections, depending on the final product's operational requirements. As shown in FIG. 11, these function as signal connections such that a conductive pin 65 (only one shown), when inserted therein, will be electrically connected to selected signal planes (represented by the letter S in FIG. 11). In FIG. 11, the signal lines in each signal plane project toward the viewer, with selected ones of these being shown as physically engaging one of the PTH's 63. Should PTH's 63 function as power connections, selected ones of the power planes will be connected thereto rather than the signal planes as illustrated. In FIG. 11, the power planes (P) are shown as not being so connected, the PTH's passing though and not contacting the clearance apertures (41) described above. By way of example, pins 65 may be from electronic modules which are connected to the composite board and which thus provide electrical connection to the respective signal layers therein in a predetermined, desired manner while being electrically isolated from the power plane elements. The orientation depicted in FIG. 11 is thus not meant to limit the invention in any manner. It is also understood that formation of the multilayered, composite printed circuit board assembly 60 as depicted in FIG. 11 requires the provision of additional steps (e.g., through hole formation). Such additional operations are within the scope of the art and further definition is thus not provided. In those situations wherein a pin connection may or may not be utilized, it is understood that the conductive material of the PTH also provides connection between designated signal planes. Use of such pins may not be desired in some embodiments of the invention, as it may only be necessary to interconnect selected signal lines (or planes) depending on the product's operational requirements.

Significantly, the invention has provided a power plane component readily capable of being utilized within a multilayered printed circuit board assembly to provide at least two electrically isolated regions therein for enhanced operation of said assembly. Also significantly, these separated, isolated regions are provided in a substantially mechanical fashion without the need for wet/chemical processing and the inherent disadvantages thereof. And, equally significant, the thin power planes as produced in accordance with the teachings of the invention possess enhanced dimensional control during the aforedefined processing operations and also during final lamination wherein the plane(s) is(are) incorporated within a multilayered printed circuit board assembly. Further, the mechanical operations as defined herein are capable of being performed in a relatively facile and expeditious manner to thus reduce the overall cost for manufacturing this product. Still further, the invention as defined herein eliminates the aforementioned disadvantages of prior mechanical processes (e.g., the substantial elimination of burrs within the copper conductor) in the final product. Each of the circuit members as produced herein is thus capable of providing multiple voltages along a singular plane to thus provide different functions (e.g., ground and signal) within such a singular plane. The method as used to produce the circuit member defined herein is also readily adapted for mass production, eliminating many of the aforementioned disadvantages of prior techniques.

What is claimed is:

1. A method of making an electrically conductive circuit member for use within a multilayered circuit board assembly, said method comprising:
   providing a sheet of electrically conductive material;
   forming a plurality of first openings within said electrically conductive sheet at predetermined locations therein;
   encapsulating said electrically conductive sheet having said first openings therein between first and second layers of electrically insulative material;
   providing a plurality of apertures within said encapsulated electrically conductive sheet; and
   providing a plurality of second openings within said encapsulated electrically conductive sheet relative to said plurality of first openings to define said circuit member having at least two electrically isolated regions within said electrically conductive sheet, said circuit member adapted for being combined with additional circuit members to form a multilayered circuit board assembly.

2. The method of claim 1 further including the step of oxidizing the outer surfaces of said electrically conductive material prior to said encapsulating thereof.

3. The method of claim 1 wherein said electrically conductive material is selected from the group consisting of copper, aluminum, molybdenum, copper alloys, nickel-iron alloys, or combinations thereof.

4. The method of claim 1 further including the step of positioning a plurality of said conductive sheets in a stacked arrangement, said first openings being provided within each of said sheets in a substantially simultaneous manner.

5. The method of claim 4 wherein said pluralities of said first openings are provided using a process selected from the group consisting of milling, drilling and punching.

6. The method of claim 1 wherein said encapsulating of said electrically conductive sheet includes positioning said sheet on a first sheet of said electrically insulative material and thereafter positioning a second sheet of said electrically insulative material thereover, said sheets of insulative material thereafter being bonded to said sheet of conductive material to define a circuit subassembly.

7. The method of claim 6 wherein said bonding is accomplished by lamination.

8. The method of claim 7 wherein said insulative material is partially cured prepreg material, said prepreg material being substantially fully cured during said lamination.

9. The method of claim 6 further including the step of positioning a plurality of said conductive sheets each having outer layers of said insulative material adjacent thereto in a stacked, aligned arrangement, said plurality of subassemblies thereafter being laminated in a substantially simultaneous manner.

10. The method of claim 9 further including positioning a sheet of release material between each of said subassemblies prior to said simultaneous lamination thereof to facilitate separation of said subassemblies subsequent to said lamination.

11. The method of claim 10, wherein said lamination is accomplished at a temperature within the range of from about 340° F. to about 380° F. and at a pressure within the range of from about 200 P.S.I. to about 700 P.S.I.

12. The method of claim 11 wherein said temperature is about 350° F. and said pressure is about 500 P.S.I.

13. The method of claim 1 wherein said apertures are provided within said conductive sheet by drilling.

14. The method of claim 1 further including positioning a plurality of said encapsulated conductive sheets in a stacked, aligned orientation, said second openings being provided in each of said encapsulated conductive sheets in a substantially simultaneous manner.

15. The method of claim 14 further including the step of roughening the outer surfaces of the electrically insulative material of each of said encapsulated conductive sheets prior to said positioning thereof in said stacked, aligned orientation to substantially reduce the effect of static electricity on said surfaces and to work-harden said encapsulated conductive sheet.

16. The method of claim 14 wherein said pluralities of said second openings are provided using a process selected from the group consisting of milling, drilling and punching.

17. The method of claim 14 further including providing a plurality of registration openings within each of said encapsulated conductive sheets prior to said positioning thereof in said stacked, aligned orientation to facilitate said positioning in said stacked, aligned orientation.

18. The method of claim 17 wherein said registration openings are provided by punching.

19. The method of claim 17 wherein each of said encapsulated conductive sheets is positioned on a plurality of upstanding pins such that each of said pins passes through a respective one of said registration openings of each of said encapsulated conductive sheets.

20. An electrically conductive circuit member for use within a multilayered circuit board assembly, said member comprising:
   a sheet of electrically conductive material and first and second layers of electrically insulative material bonded to said sheet of conductive material to substantially encapsulate said sheet of conductive material therein, said sheet of conductive material including therein a plurality of apertures and a plurality of elongated openings defining at least two electrically isolated regions within said conductive material, said sheet of conductive material and said first and second layers of insulative material bonded thereto forming an integral, singular member of substantially planar configuration.

21. The circuit member of claim 20 wherein said sheet of conductive material is metallic.

22. The circuit member of claim 21 wherein said metallic material is selected from the group consisting of copper, molybdenum, copper alloys, nickel-iron alloys, or combinations thereof.

23. The circuit member of claim 21 wherein said metallic material is oxidized copper.

24. The circuit member of claim 20 wherein said first and second layers of said insulative material are comprised of prepreg material.

25. The circuit member of claim 24 wherein said prepreg material is comprised of resin impregnated glass cloth.

26. The invention of claim 20 wherein said circuit member is of substantially, rectangular configuration, one of said electrically isolated regions substantially forming a border about a second of said electrically isolated regions within said circuit member.

* * * * *